United States Patent [19]

King et al.

[11] Patent Number: 4,636,744
[45] Date of Patent: Jan. 13, 1987

[54] FRONT END OF AN OPERATIONAL AMPLIFIER

[75] Inventors: Ken R. King; Celimo P. Hernandez, both of Palm Bay, Fla.

[73] Assignee: Harris Corporation, Melbourne, Fla.

[21] Appl. No.: 782,689

[22] Filed: Oct. 1, 1985

[51] Int. Cl.$^4$ .............................................. H03F 3/68
[52] U.S. Cl. .................................... 330/295; 330/255; 330/257; 330/261
[58] Field of Search .................. 330/124 R, 151, 252, 330/255, 257, 261, 295, 296, 297; 307/263, 268

[56] References Cited

U.S. PATENT DOCUMENTS

| | | | |
|---|---|---|---|
| 3,801,858 | 4/1974 | Grangaard et al. | 330/124 X |
| 3,922,614 | 11/1975 | Van de Plassche | 330/257 |
| 4,227,256 | 10/1980 | O'Keefe | 330/295 X |
| 4,236,120 | 11/1980 | White | 330/297 X |
| 4,240,040 | 12/1980 | Saari | 330/255 |
| 4,250,460 | 2/1981 | Gasparik | 330/252 |
| 4,390,850 | 6/1983 | Davis et al. | 330/253 |
| 4,446,443 | 5/1984 | Johnson et al. | 330/257 |
| 4,531,099 | 7/1985 | Nakane | 330/297 X |

Primary Examiner—James B. Mullins
Attorney, Agent, or Firm—Barnes & Thornburg

[57] ABSTRACT

The front end of an operational amplifier having an improved controlled slew rate and high gain current output capabilities. The amplifier includes a slew enhancement or large signal stage connected in parallel to a normal front end or small signal stage. The small signal stage supplies a transconductance output which is approximately linearly related to the input until its slew rate limit. The slew enhancement stage is designed to provide slew current when the small signal stage reaches its slew rate limit, thereby providing an increased output current response to an increasing differential input voltage beyond the slew rate of the small signal stage. Two pair of differential amplifiers are used in both a large and small signal stage as well as an improved output stage comprising of current mirrors.

19 Claims, 4 Drawing Figures

FRONT END OF AN OPERATIONAL AMPLIFIER

BACKGROUND AND SUMMARY OF THE INVENTION

The present invention relates to an operational amplifier circuit, and more particularly to an improved front end stage of an operational amplifier having increased transconductance gain and improved slew rate characteristics.

Generally, the output current of the front end stage corresponds to a hyperbolic tangent with the input differential voltage. However, for input voltages greater than a certain magnitude, slew rate limiting occurs with the output current being equal in magnitude to that of the current sources for the front end stage, thereby resulting in no further increase in output current with increases in input differential voltages. Although various techniques have been developed to improve the slew rate and output capabilities, these techniques adversely effect other related characteristics of the amplifier such as transconductance gain, offset voltages, and temperature coefficients.

Accordingly, it is an object of this invention to provide an improved amplifier with a improved slew rate without adversely effecting the other characteristics of the front end stage of the amplifier.

It is further an object of this invention to provide an improved amplifier with high gain capabilities.

It is another object to provide a new and useful technique for increasing both the slew rate and current output capabilities of the front end stage without adversely effecting other related characteristics of the amplifier.

These and other objects are attained by providing a large signal or slew enhancement stage connected in parallel to a small signal or front end stage of an operational amplifier, thereby expanding both the slew rate and transconductance gain of the amplifier.

The small signal stage includes at least one differential transistor pair, with each pair having a differential input and a single output. The large signal stage includes a complementary set of differential transistor pairs, in addition to a pair of active loads and output means, the output means being switched on and off by the active loads.

Depending upon the polarity of the input differential voltage, the small signal stage functions as either a high gain current source or current sink for a subsequent stage of the amplifier. Until the small signal stage reaches its slew rate limit, the active loads of the large signal stage will maintain the respective output means in a nonconductive state, such that no additional current is provided to the front end stage by the large signal stage. Upon the small signal stage reaching its slew rate limit, however, one of the active loads of the large signal stage will bias its respective output means to conduct, thereby allowing this second stage to either serve as as additional current source or current sink to the output of the front end stage. Which active load and output means will conduct depends upon the polarity of the differential voltage applied to the parallel inputs of the differential transistor pairs.

These and other objects, advantages and novel features of the present invention will become apparent from the following detailed description of the invention when considered in conjunction with the accompanying drawings.

DETAILED DESCRIPTION OF THE DRAWINGS

Figure 1:
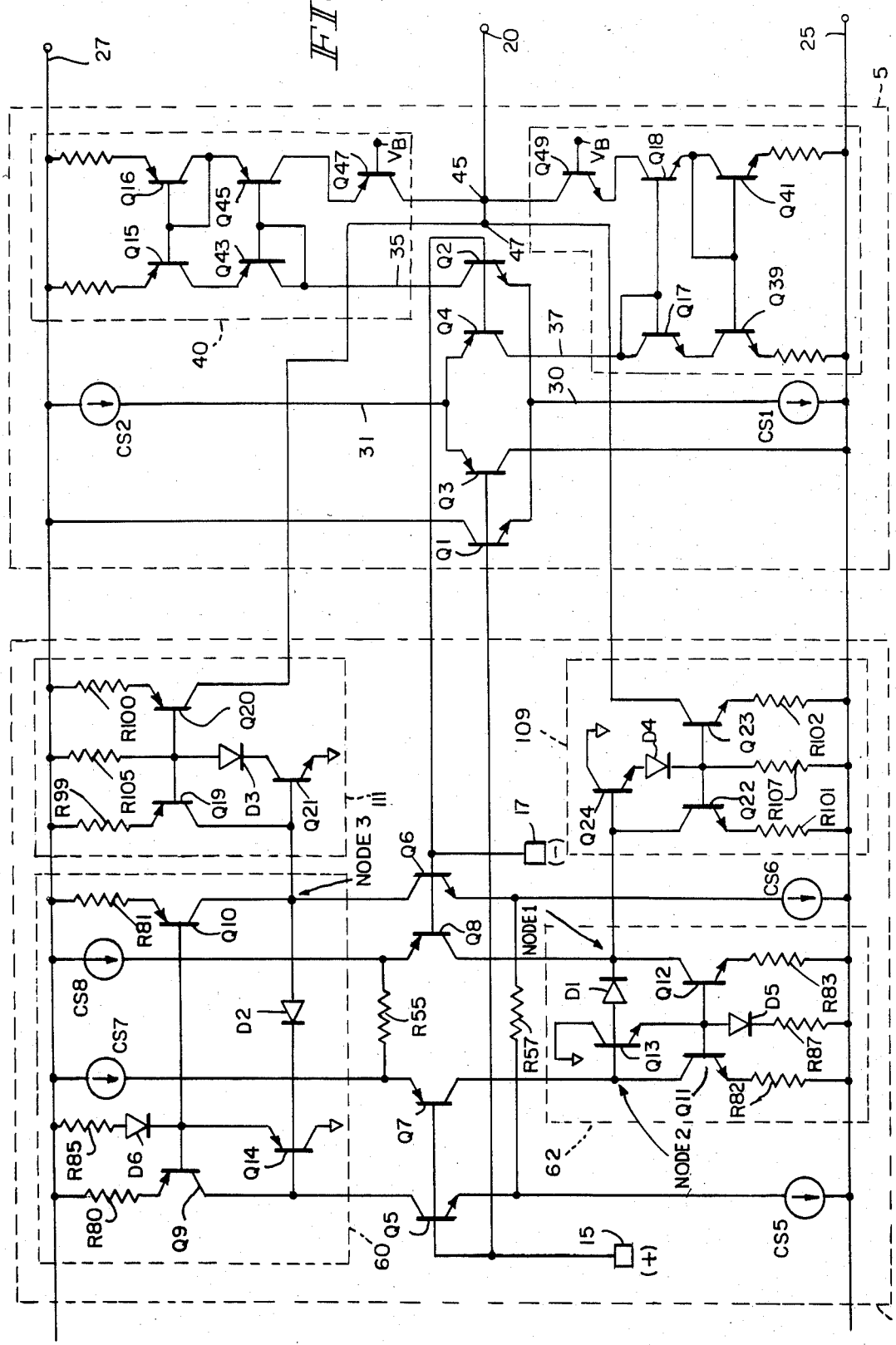
FIG. 1 represents a schematic diagram of the slew enhancement or large signal stage in parallel with a normal front end stage of an operational amplifier incorporating the principles of the present invention.

Referring to FIG. 1, the front end or small signal stage 5 is shown connected in parallel to a large signal or slew enhancement stage 10, the two stages embodying various aspects of the invention. The combined stages have two input terminals for receiving a differential input voltage, one of the terminals being designated as positive 15 and the other terminal being designated as negative 17. The circuit shown also has a pair of summing nodes 45 and 47, each communicating with the other to form a single output 20, whereby current will either flow into the output 20 from an additional stage not shown or will flow out at the output 20 into the additional stage. The direction of the current depends upon the polarity of the input differential voltage at 15 and 17, with the magnitude of the current corresponding to the magnitude of the voltage differential at the input.

The small signal stage 5 includes two differential transistor pairs, one pair consisting of NPN transistors $Q_1$, $Q_2$ and the other pair of PNP transistors $Q_3$, $Q_4$. The positive input terminal 15 is coupled to the bases of complementary transistor $Q_1$ and $Q_3$ while the negative input terminal 17 is coupled to the bases of complementary transistors $Q_2$ and $Q_4$, thereby forming NPN and PNP differential inputs.

Current sources CS1 and CS2 are coupled in between the common emitters 30 and 31 of the respective transistor pairs and the respective supply rails 25 and 27. These current sources should be closely matched for minimizing the offset voltage of the amplifier. The collector legs of the transistors $Q_1$ and $Q_3$ are coupled to supply rails 27 and 25 respectively. The other two collector legs of $Q_2$ and $Q_4$ function as the outputs 35 and 37 of the transistor pairs respectively. These outputs are coupled to a summing node 45 respectively via current mirror pairs 40 and 42. The current mirror pairs, with each mirror having a one to one ratio, reflect the respective output current of the transistor pairs to the summing node 45.

Depending upon the polarity of the differential input voltage the output of the small signal stage will be derived predominantly from one of the differential transistor pairs and their respective current mirror pairs. Thus for an input differential voltage in which the positive terminal 15 is more positive than the negative terminal 17, the PNP transistor pair $Q_3$ and $Q_4$ will be biased such that the current mirrors 42 are driven at $Q_{17}$ and $Q_{39}$, thereby creating a reflected current in $Q_{18}$ and $Q_{41}$. The current provided to the reflecting legs of current mirror pairs 42 will originate from a succeeding stage not shown, and flow into the output 20 at node 45 and down to the lower supply rail 25 via $Q_{49}$, $Q_{18}$ and $Q_{41}$. For the opposite polarity applied at the differential inputs, the NPN transistor pair $Q_1$ and $Q_2$ will be biased such that $Q_2$ draws in current from the supply rail 27 through the respective current mirror transistors $Q_{15}$ and $Q_{43}$, thereby creating a reflected current in $Q_{16}$ and $Q_{45}$, with the reflected current flowing from the upper supply rail 27 through $Q_{16}$, $Q_{45}$ and $Q_{47}$ to the summing node 45 leading to the output 20. By having two current mirrors at the outputs of the differential pairs, base current cancellation results at the high impedance node 45, thereby producing reducing dc offset voltages of the small signal stage. Common base transistors $Q_{47}$ and $Q_{49}$ are arranged between the collector legs of $Q_{45}$ and $Q_{18}$ respectively, to compensate for the base current of $Q_4$ and $Q_2$ respectively. The base voltage Vb is supplied by a control dc voltage source.

The large signal or slew enhancement stage 10 includes an input stage comprising of two differential transistor pairs, one pair consisting of NPN transistors, $Q_5$ and $Q_6$ and the other pair consisting of PNP transistors $Q_7$ and $Q_8$. Similar to the small signal stage 5, the positive input terminal 15 is coupled to the bases of complementary transistors $Q_5$ and $Q_7$, with the negative terminal 17 coupled to the bases of complementary transistors $Q_6$ and $Q_8$. The inputs are in turn connected in parallel to the corresponding like pair of inputs of the small signal stage 5. Also similar to the small signal stage, the differential pairs of the large signal stage will either cause its output to supply or sink current, depending upon the polarity of the differential input voltage. The large signal stage will thus produce an output current corresponding to the polarity and magnitude of the differential input voltage.

Each differential pair has its emitters connected to a supply rail, via a current source in each leg respectively. Current Sources CS5 and CS6 are connected to the emitters of $Q_5$ and $Q_6$ respectively while currents CS7 and CS8 are connected to the emitters of $Q_7$ and $Q_8$ respectively.

Resistors 55 and 57 are coupled across the emitters of $Q_7$, $Q_8$, and $Q_5$, $Q_6$ respectively. Active loads, 60 and 62, are coupled between the output collector legs of $Q_5$, $Q_6$ and $Q_7$, $Q_8$ respectively. The active loads include current mirrors comprised of either PNP transistor pair $Q_9$ and $Q_{10}$ or NPN transistor pair $Q_{11}$ and $Q_{12}$, the former being coupled to the NPN differential pair $Q_5$ and $Q_6$ and the latter being coupled to the PNP differential pair $Q_7$ and $Q_8$. Resistors 80, 81, 82 and 83 are coupled between the emitters of the respective transistor and one of the supply rails. The resistance value of these four resistors are chosen such that there is a slight gain in the mirrored current of the output of the active loads, with this output being taken at the collectors of transistors $Q_{10}$ and $Q_{12}$ respectively.

The transistors $Q_{13}$ and $Q_{14}$ in conjunction with diodes $D_1$ and $D_2$ respectively are coupled between the collectors of their respective active loads 60 and 62. Diodes $D_1$ and $D_2$ serve to clamp transistors $Q_{12}$ and $Q_{10}$ respectively at nodes 1 and 3. They also in conjunction with the respective transistors $Q_{13}$ and $Q_{14}$ prevent $Q_{12}$ and $Q_{10}$ from saturating when in operation.

The base of $Q_{13}$ is connected to both the anode of $D_1$ and the collectors of $Q_7$ and $Q_{11}$, while the collector of $Q_{13}$ is grounded. The cathode of $D_1$ is connected to the collectors of $Q_8$ and $Q_{12}$ and to the input of an output means 109. Diode $D_5$ is coupled between the emitter of $Q_{13}$ and the lower supply rail 25 via resistance 87. Resistors 82 and 83 are coupled between the respective emitters of $Q_{11}$ and $Q_{12}$ and the supply rail 25.

In similar fashion, the base of $Q_{14}$ is connected to the cathode of $D_2$ and the collectors of $Q_5$ and $Q_9$, while the collector of $Q_{14}$ is grounded. The anode of $D_2$ is connected to the collectors of $Q_6$ and $Q_{10}$ and to the input of its output means 111. Diode $D_6$ is coupled between the emitter of $Q_{14}$ and the upper supply rail 27 via resistance 85. Resistors 80 and 81 are coupled between the respective emitters of $Q_9$ and $Q_{10}$ and the supply rail 27.

The output means 109 and 111 are shown as high gain current mirrors including an NPN transistor pair $Q_{22}$ and $Q_{23}$ and an PNP transistor pair $Q_{19}$ and $Q_{20}$ respectively, each pair having its input coupled to the output of its corresponding active loads 60, 62. The current mirror outputs are coupled to the summing node 47 where current provided by or to the current mirrors of the large signal stage 10 is combined with the current output from the small signal stage 5, for providing a total current at the output 20 of the circuit.

The transistors $Q_{21}$ and $Q_{24}$ and respective series diode $D_3$ and $D_4$ of the respective current mirrors 111 and 109, are connected across the collectors and bases of $Q_{19}$ and $Q_{22}$ respectively. The collectors of transistors $Q_{21}$ and $Q_{24}$ are connected to ground.

Resistors 101 and 102 of the current mirror 109 are coupled between the lower supply rail 25 and the emitters of $Q_{22}$ and $Q_{23}$ respectively. The bases of $Q_{22}$ and $Q_{23}$ are coupled to each other and to the cathode of $D_4$ and the supply rail 25 via resistance 107. The collector of $Q_{22}$ is connected to the output of the active load 62 at the node 1 and also to the base of $Q_{24}$. The collector of $Q_{23}$ is connected to the output 20 via summing node 47.

In similar fashion, resistors 99 and 100 of the current mirror means 111 are coupled between the upper supply rail 27 and the emitters of $Q_{19}$ and $Q_{20}$ respectively. The bases of $Q_{19}$ and $Q_{20}$ are coupled to each other and to the anode of $D_3$ and the supply rail 27 via resistance 105. The collector of $Q_{19}$ is connected to the output of the active load 60 and also to base of $Q_{21}$. The collector of $Q_{20}$ is connected to the output 20 via summing node 47.

For ease of discussion, the following explanation of the large signal stage operation will focus on only the lower half of the circuit as it responds to varying polarity of differential input voltages. The other half of the circuit, however, responds in a like manner with respect to input voltages which are of the opposite polarity to those discussed below. Also both lower and upper halves of the large signal stage respond simarlarly under balanced conditions.

Under balanced conditions, corresponding to the same voltage potential being applied at both inputs 15 and 17, transistors $Q_7$ and $Q_8$ of the large signal stage 10 conducts with equal currents flowing through them. Because the current mirror of the active load 62 is made to have a slight gain resulting from resistor 82 having a slightly larger resistance value than resistor 83, the transistor $Q_{12}$ pulls more current than the transistor $Q_{11}$. This causes the voltage at the node 1 to fall toward the potential of the lower supply rail 25, until $D_1$ clamps thereby preventing $Q_{12}$ from saturating. Under these conditions, the high gain current mirror 109 is biased in a nonconductive state.

Transistor $Q_{13}$ is used to bridge the base-collector of the current mirror input, device $Q_{11}$, instead of a short circuit, in order to bring the voltage up one diode at node 1 to compensate for the voltage drop of the clamping diode $D_1$; otherwise, $Q_{12}$ would go into saturation. The combination of diode drops of the base-emitter junction of $Q_{13}$ and of $D_1$ provide the same voltage at both the collector and base of $Q_{12}$, thereby preventing $Q_{12}$ from saturating under balanced conditions. Current flowing through $Q_{12}$ will be equal to that flowing through $Q_{11}$ increased by the slight gain of the active load 62, the gain being equal to the value of resistor 82 divided by the value of resistor 83.

Also under these balanced conditions, the voltage at node 2 will be equivalent to the voltage across two diodes (Vbe of $Q_{13}$, $Q_{11}$) and across the resistance 82 above supply potential at 25, while the voltage at node 1 will be one diode drop down from node 2 due to the conducting of diode D1. Because the high gain current mirror 109 requires at least a potential equivalent to three diode drops above rail 25 at node 1 in order for it to conduct, it will remain off and the current at the output of the circuit 20 will only be that of the small signal stage 5.

When the potential becomes more positive at the input 17 with respect to the input 15, the high gain current mirror 109 remains off, although the current mirror 111 in the other half of the large signal stage will begin to conduct. As the voltage differential becomes more positive at input 17, $Q_7$ is biased on more than $Q_8$. This results in the current from the current source CS8, which normally flows into the emitter of $Q_8$ under balanced conditions being diverted through resistor 55 and to the emitter of $Q_7$. The current flowing out of the collector of $Q_7$ will continue to maintain the voltage at nodes 1 at relatively the same potential as under balanced conditions, with $D_1$ and $Q_{11}$ conducting approximately equal currents with $D_1$ continuing to clamp $Q_{12}$ at node 1. This will also continue to maintain the high gain current mirror 109 of this half of the circuit in a non-conductive state.

When the potential becomes more positive at the input 15 with respect to input 17, the high gain current mirror 109 will begin to conduct at a selected potential determined by the ratio of the resistance values of 82 and 83. As the voltage differential increases in this polarity, $Q_8$ begins to conduct more than $Q_7$ with the current from current source CS7 being diverted from the emitter of $Q_7$ through resistance 55 and adding to current already flowing through $Q_8$ from current source CS8. As a result, the current flowing from the collector of $Q_8$ will be larger than the current flowing from the collector of $Q_7$. As the current from $Q_8$ increases to equal the current through $Q_{12}$, the clamping diode $D_1$ will turn off. A further increase in the differential voltage at this point will cause the high gain current mirror 109 to turn on, the voltage at node 1 increasing sufficiently to allow $Q_{22}$ to conduct with a reflected current resulting in $Q_{23}$. The reflected current will have a gain equal to the ratio of resistance values of resistors 101 and 102.

The amplified current provided by the high gain current mirror 109 is communicated to the summing node 47 where it is combined with the small signal stage output at summing node 45 to produce the current output of the circuit 20.

The period under which the high gain mirror is non-conductive is determined by the ratio of resistance values 82 and 83 and is thus a controllable variable. This period is generally referred to as the "dead zone." By choosing the ratio of resistances to cause the high gain current mirrors of the respective halves of the large signal stage to begin conducting respectively when the small signal stage begins to slew rate limit, the total output current of the circuit will reflect an approximate linear transconductance response to an increasing differential input voltage beyond the slew rate limit of the small signal stage. The peak current output of the large signal stage is equal to the value of the differential input voltage divided by the value of either resistors 55 and 57, this quantity multiplied by the gain of the high gain current mirror. Thus, the peak current is also a controllable variable by varying the value of the resistors 55 and 57, or by changing the gain of the high gain current mirror. $D_5$ or $D_6$ may be included in the active loads to help stabilize the active load transistors $Q_{13}$ and $Q_{14}$ respectively, when the circuit is operated in high ambient temperatures. Similarly, $D_3$ and $D_4$ which are connected to the emitters of $Q_{21}$ and $Q_{24}$ respectively, help provide the necessary base-collector voltage to $Q_{19}$ and $Q_{22}$ respectively, at high ambient temperatures.

Figure 2:
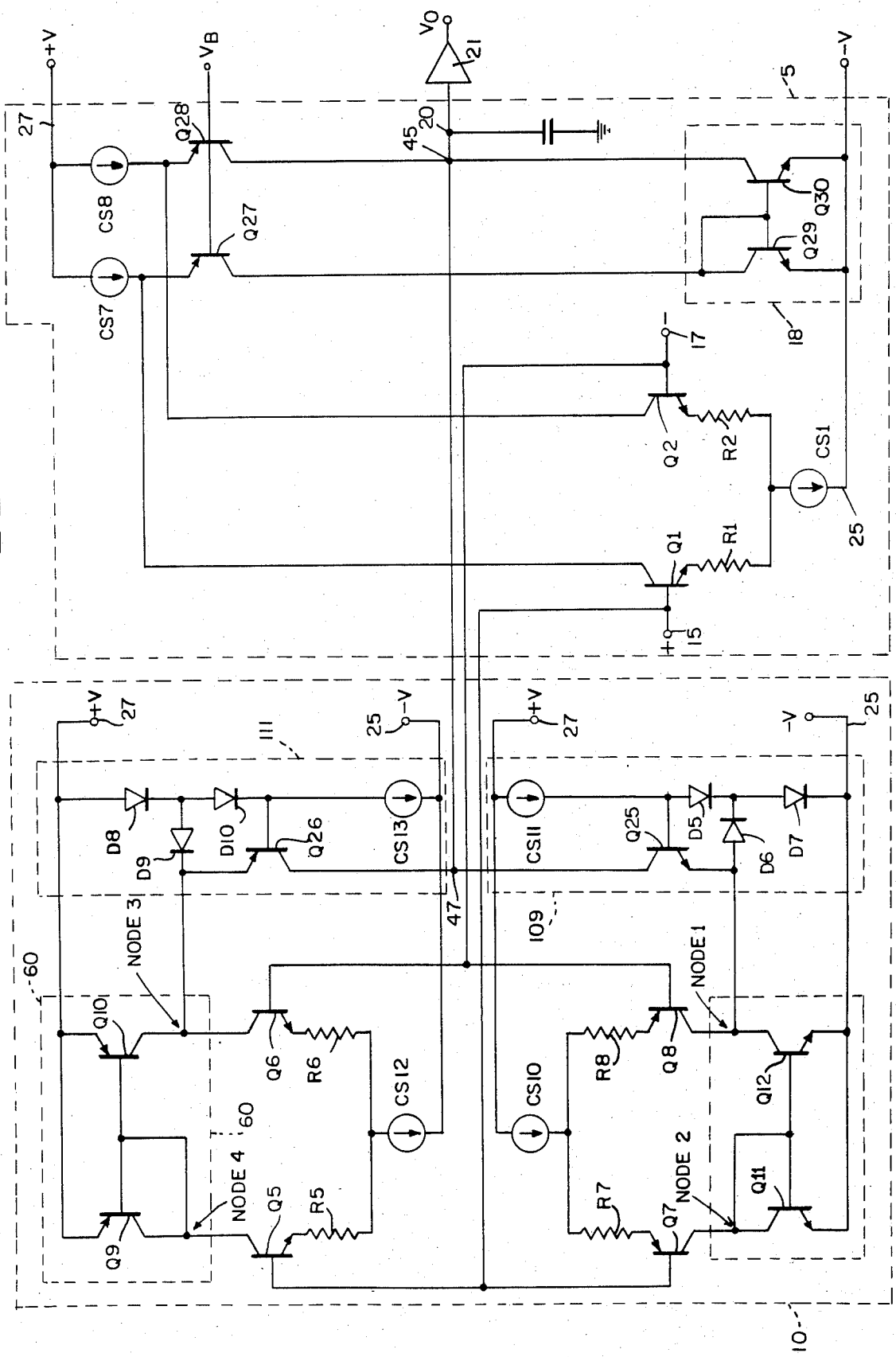
FIG. 2 represents a schematic diagram of another embodiment of the slew enhancement stage in parallel with a normal front end stage incorporating the principles of the present invention.

Referring to FIG. 2, another embodiment of the invention similar to the previous figure, shows a front end of an operational amplifier 5 in parallel with a slew enhancement or large signal stage 10. The combined stages have two input terminals as in FIG. 1 designated as positive 15 and negative 17. The circuit also has summing nodes 45 and 47, each communicating with the other to form a single output 20, whereby current will either flow into the output 20 from a buffer stage 21 or will flow out at the output 20 into the buffer stage 21. The direction of the current as with the previous embodiment, depends upon the polarity of the input differential voltage at 15 and 17.

The small signal stage 5 includes a differential transistor pair consisting of two NPN transistors $Q_1$ and $Q_2$. The positive input 15 is connected to the base of $Q_1$ and the negative input 17 is connected to the base of $Q_2$. Resistors R1 and R2 are coupled between the emitters of $Q_1$ and $Q_2$ respectively, and the lower supply rail 25 via current source CS1. The collector of $Q_1$ is connected to current source CS7 and to the emitter of output transistor $Q_{27}$, while the collector of $Q_2$ is connected to the current source CS8 and the emitter of output transistor $Q_{28}$. The current sources should be closely matched such that offset voltages of the small signal stage 5 are minimized. $Q_{27}$ and $Q_{28}$ are PNP transistors, with their collectors being connected to the input and output sides of current mirror 18 respectively. $Q_{27}$ and $Q_{28}$ are biased with a constant supply source at their bases by $V_B$. The current mirror 18 comprises of NPN transistors $Q_{29}$ and $Q_{30}$ with a short applied between the collector of $Q_{29}$ and the bases of both $Q_{29}$ and $Q_{30}$.

As with the first embodiment, the large signal stage 10 includes an input stage comprising of two differential transistor pairs; one pair of NPN transistors, $Q_5$ and $Q_6$, and another pair of PNP transistors, $Q_7$ and $Q_8$. The positive input terminal 15 is coupled to the bases of complementary transistors $Q_5$ and $Q_7$, with the negative terminal 17 coupled to the bases of complementary transistors $Q_6$ and $Q_8$. These inputs are inturn connected in parallel to the inputs of the small signal stage 5.

Transistor pair $Q_5$ and $Q_6$ have their emitters coupled together via resistors R5 and R6, with the common node coupled to the lower supply rail 25 via current source CS12. Similarly, transistor pair $Q_7$ and $Q_8$ have their emitters coupled together via resistors R7 and R8, with the common node coupled to the upper supply rail 27 via current source CS10. Active loads 60 and 62 are coupled between the output collector legs of the differential transistor pairs. The active loads include current mirrors comprised of either a PNP transistor pair $Q_9$ and $Q_{10}$ or a NPN transistor pair $Q_{11}$ and $Q_{12}$, the former being coupled to the NPN differential pair $Q_5$ and $Q_6$, and the latter being coupled to the PNP differential pair $Q_7$ and $Q_8$. The output of the active loads 60, 62 are all connected to the input of output means 111 and 109 respectively.

The upper output means 111 includes diodes, $D_8$, $D_9$, $D_{10}$ and PNP transistor $Q_{26}$. The cathode of $D_8$ is connected to the upper supply rail 27, with the anode of $D_8$ being connected to the cathode of $D_9$ and the anode of $D_{10}$. $D_9$ and $D_{10}$ form a bridge across the base-emitter of transistor $Q_{26}$, with the base of $Q_{26}$ and anode of $D_3$ being connected to the lower supply rail 25 via current source CS13. The emitter of $Q_{26}$ is coupled to the anode of $D_9$ and the output of the active load 60. The collector of $Q_{26}$ is connected to output 20 via the summing nodes 45 and 47.

The lower output means 109 includes diodes $D_5$, $D_6$, $D_7$ and NPN transistor $Q_{25}$. The anode of $D_7$ is connected to the lower supply rail 25 with the cathode of $D_7$ being connected to the anodes of $D_5$ and $D_6$. $D_5$ and $D_6$ form a bridge across the base-emitter of transistor $Q_{25}$, with the base of $Q_{25}$ and cathode $D_5$ being connected to the upper supply rail 27 via current source CS 11. The emitter of $Q_{25}$ is coupled to the cathode of $D_6$ and the output of the active load 62. The collector of $Q_{25}$ is connected to output 20 via the summing nodes 45 and 47.

As a more positive potential is applied to the input terminal 17 with respect to terminal 15, $Q_2$ of the small signal stage 5 is biased on more than $Q_1$ resulting in current being drawn from current source CS8 to $Q_2$ leaving little current remaining to flow through output transistor $Q_{28}$. Because $Q_1$ is biased off more, thereby conducting less current, current from current source CS7 to will flow through output transistor $Q_{27}$ and into the input leg of the current mirror 15. This produces a reflected current in the output leg of the mirror, thereby providing a current sink for the output 20 of the circuit.

When a more positive potential is applied to the input terminal 15 with respect to terminal 17, $Q_2$ begins to turn off more with $Q_1$ biased to conduct more. This results in current being drawn from current source CS7 to $Q_1$, leaving little current remaining to flow through $Q_{27}$. With $Q_{27}$ supplying less current to the input leg of the current mirror, less current will therefore, be reflected in the output leg of the mirror as well. Because $Q_2$ is is biased to conduct less, with this polarity of differential input voltage, current from current source CS8 will be drawn through $Q_{28}$ instead of $Q_2$. As the differential input voltage is increased more, less current is drawn in the output leg of the current mirror 15, with more current thereby flowing to the output 20 from $Q_{28}$. However, upon a sufficient voltage magnitude at the small signal stage inputs, the small signal stage output current will equal that of the current sources CS7 and CS8 and slew rate limiting occurs. It is at this point the large signal stage begins to provide additional slew current.

With regard to the upper half of the large signal stage, transistors $Q_5$, $Q_6$, $Q_9$, $Q_{10}$ and resistors R5 and R6 of the active load 60 have values set so that under small signal conditions, the collector current of $Q_6$ is greater than the emitter current of $Q_{10}$. The difference in these currents causes node 3 to fall in voltage until the diode $D_9$ clamps it. When node 3 is clamped, transistor $Q_{26}$ of the output means 111 will be off, thereby contributing no current to the output 20 of the circuit. A similar set up and response exists for active load 62 and output means 109.

As the voltage becomes sufficiently more positive at input terminal 15 with respect to input terminal 17, $Q_6$ will be biased off sufficiently such that the current through $Q_{10}$ will equal or exceed the current through $Q_6$. When this occurs, the potential at node 3 will rise until the emitter of $Q_{26}$ conducts and the difference in current between $Q_{10}$ and $Q_6$ will flow through $Q_{26}$ and to the output 20 of the circuit via summing means 45 and 47, where it will add to the current supplied by the small signal stage 5. As a result of the PNP configuration of the lower half of the large signal stage, when the potential becomes more positive at input 15 with respect to input 17, the differential pair $Q_7$ and $Q_8$ will bias the active load 62 such that the active load will prevent the output means 109 from contributing current to output 20, by biasing $Q_{25}$ off.

When the input terminal 17 increases sufficiently more positive than input terminal 15, the lower half of the large signal stage conducts current to it from the output 20, while the upper half now remains off. As a result of this polarity of input voltage, $Q_7$ is biased on more than $Q_8$. Because the one to one ratio of the current mirror in the active load 62 requires equal current in both its input and output legs, current will be drawn from the output 20 to $Q_{12}$ via $Q_{25}$ in order to provide the reflected current of the current mirror. This, therefore, balances the current both the input and output legs of the mirror, and as a result, provides an additional current sink to the circuit for large signal inputs.

Figure 3:
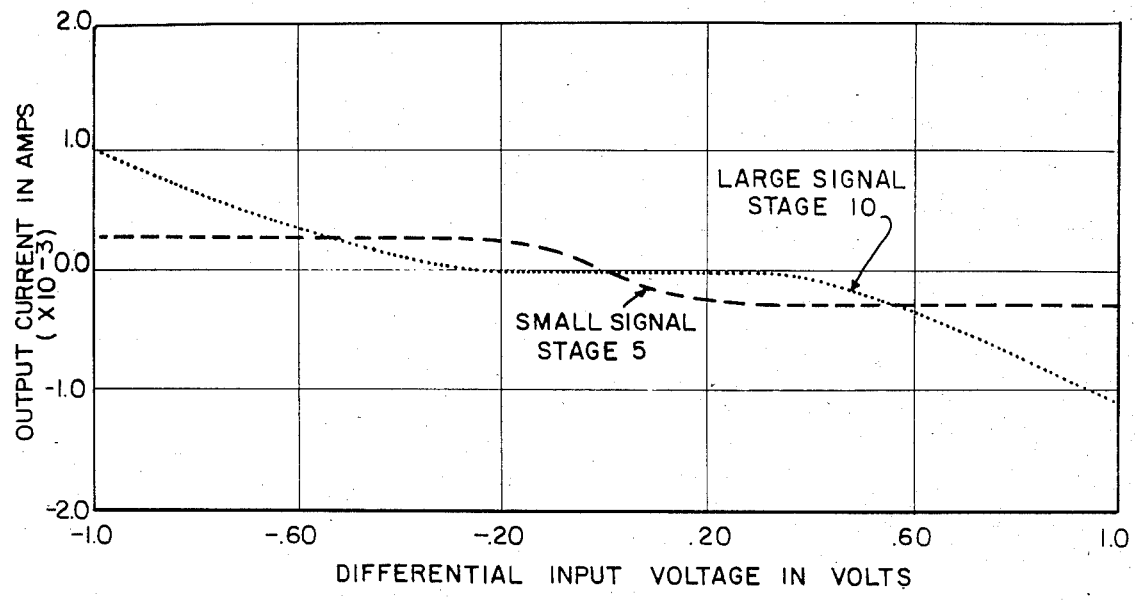
FIG. 3 is a graphical representation of the separate transfer characteristics of the small signal stage and the slew enhancement stage.

FIG. 3 graphically shows the transfer characteristics of both the small signal stage 5 and the large signal stage 10. For the type of amplifier described in FIG. 1, the output of the small signal stage 5 responds approximately linearly for a small signal differential input of approximately between ±0.20 volts. During this range, the output of the large signal stage 10 is zero representing the "dead zone," by which the high gain current mirrors are biased off.

For differential voltages greater than ±0.20 volts, slew rate limiting occurs with the small signal stage 5 and no additional current is produced from this stage with any further increase in differential input voltage as shown in the Figure. The large signal stage 10, however, begins to conduct supplying an output current that linearly reflects the differential input voltage.

Figure 4:
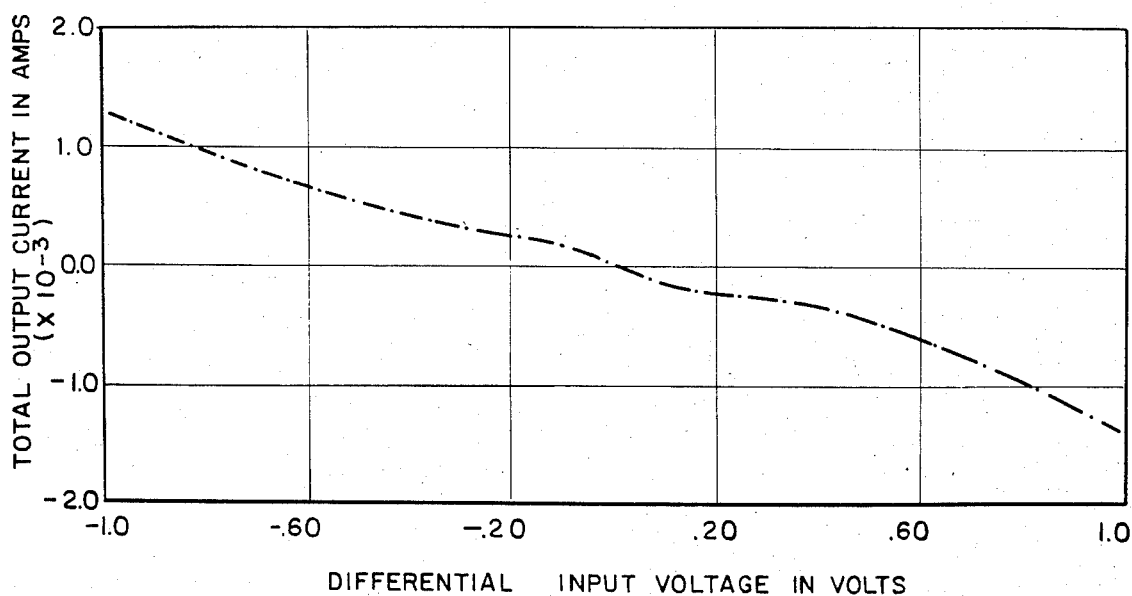
FIG. 4 is a graphical representation of the transfer characteristics of the improved circuit, showing the combined output current supplied by both the small signal stage and the large signal stage.

FIG. 4 graphically shows the transfer characteristics of the improved amplifier circuit representing the summation of the output currents of both the small signal stage 5 and large signal stage 10.

From the preceeding description of the preferred embodiments, it is evident that the objects of the invention are attained, and although the invention has been described and illustrated in detail, it is to be clearly understood that the same is by way of illustration and example only and is not to be taken by way of limitation.

An example of this is the use of other types of transistors other than bipolars. Therefore, the spirit and scope of the invention are to be limited only by the terms of the appended claims.

What is claimed is:

1. In an amplifier circuit having an input stage and an output stage, said amplifier circuit comprising:
a small signal amplification means in said input stage for providing an output current in response to a differential input voltage;
a large signal amplification means in said input stage connected electrically in parallel with said small signal amplification means for providing additional slew current, wherein said large signal amplification means includes an input means connected to an active load means connected to a high gain current mirror means for providing control over when the additional slew current will be added to the output of said small signal amplification means such that slew current is provided only when said input differential voltage is at least a predetermined value; and
summing means coupled between the outputs of said small signal amplification means and said large signal amplification means for providing a combined output current to said output stage for said amplifier circuit.

2. The amplifier circuit of claim 1, wherein said large signal amplification input means includes two differential transistor pairs, each having two inputs connected in Parallel to a corresponding like pair of inputs of said small signal amplification means and two outputs, whereby depending upon the polarity and magnitude of the input differential voltage, one of the differential transistor pairs will cause slew current to either be sunk or supplied at one of said outputs of said large signal amplification means.

3. The amplifier circuit of claim 2, wherein said active load means is connected between respective outputs of said differential transistor pairs and inputs to said current mirror means for biasing said current mirror means to a non-conductive state when the differential input voltage is within said predetermined value and biasing said current mirror means to a conductive state when said differential input is greater than said predetermined value, a respective output of said high gain current mirror means is connected to said summing means for conducting slew current to said summing means when said current mirror means is in a conducting state.

4. The amplifier circuit of claim 3, wherein said small signal amplification means includes at least one differential transistor pair having two inputs and an output for providing a small signal current output which corresponds directly with a differential voltage input.

5. The amplifier circuit of claim 4, wherein said small signal amplification means further includes an output coupling means coupled between said output of said differential transistor pair and the input to said summing means, said output coupling means including a pair of current mirror means for reflecting to said summing means the output signal of said differential pair to said summing means.

6. The amplifier circuit of claim 1, wherein said large signal amplification input means includes a differential transistor pair having two inputs and two outputs, said transistor inputs connected in parallel to a corresponding like pair of inputs of said small signal amplification means, and said outputs connected to said active load means.

7. The amplifier circuit claim 6, wherein said active load means being connected between the outputs of said differential transistor pairs and the inputs to said high gain current mirror means for biasing said current mirror means to a non-conductive state when the differential input voltage is within a specified value and biasing said current mirror means to a conductive state when said differential input voltage is greater than said specified value.

8. In an amplifier circuit having an input and an output stage, said circuit comprising:
a small signal amplification means in said input stage for providing an output current in response to a differential input voltage, wherein said small signal amplification means includes two differential pairs of transistors each having two inputs and an output;
a large signal amplification means in said input stage connected electrically in parallel with said small signal amplification means, wherein said large signal amplification means includes two differential transistor pairs, each having two inputs connected in parallel to a corresponding like pair of inputs of said small signal amplification means, for providing additional slew current to said output stage when said differential input voltage is at least a predetermined value or when slew rate limiting occurs, and an active load means connected to each of said transistor pair and a high gain current mirror means connected to each of said active load means for providing control over when the additional slew current will be added to the output of the small signal amplification means; and
summing means coupled between the outputs of said small signal amplification means and said large signal amplification means for providing a combined output current for said amplifier circuit.

9. The amplifier circuit of claim 8, wherein said small signal amplification means will either sink or supply current at the output of said small signal amplification means depending upon the polarity of the input differential voltage.

10. The amplifier circuit of claim 9, wherein each differential transistor pair of said small signal amplification means includes a pair of current mirrors connected between the respective outputs of said small signal amplification means and said summing means for providing a small signal current at the output of the small signal amplification means which directly corresponds to said differential voltage input.

11. An amplifier circuit having an input and an output stage, comprising:
a small signal amplification means in said input stage for providing an output current as a function of a differential input voltage, up to a slew rate limit;
a slew enhancement means in said input stage connected in parallel with said small signal amplification means, for providing additional slew output current when said slew rate limit occurs, wherein said slew enhancement means includes an active load means and high gain current mirror means for providing control over when the additional slew current will be provided to the output of said small signal amplification means;
summing means coupled between the outputs of said small signal amplification means and said slew enhancement means for providing a current output to said output stage for said amplifier circuit.

12. The amplifier circuit of claim 11, wherein said small signal amplification means includes a differential amplifier consisting of at least one differential transistor pair having two inputs and one output, for providing a small signal current output which corresponds directly with the differential voltage input.

13. The amplifier circuit of claim 12, wherein said small signal amplification means further includes at least one current mirror means coupled between the output of said small signal means and the input of said summing means.

14. The amplifier circuit of claim 13, wherein said slew enhancement means further includes two differential transistor pairs, the inputs of each pair being connected in parallel with the inputs of said small signal amplification means.

15. The amplifier circuit of claim 14, wherein, said active load means is connected between the respective output of said transistor pairs and the input of said current mirror means, said current mirror output connected to the input of said summing means, whereby slew current may be combined with the output of said small signal amplification means to form a combined output signal.

16. The amplifier circuit of claim 15, wherein said active load means biases said current mirror means to a non-conducting state when said differential input voltage is within said slew rate limit and in a conducting state when said differential input voltage is above said slew rate limit.

17. An amplifier circuit having an input and an output stage, said circuit comprising:
a small signal amplificaton means in said input stage for providing an output current as a function of a differential input voltage, up to a slew rate limit, wherein said small signal amplication means includes two different pairs of transistors having two inputs and an output;
a slew enhancement means in said input stage connected in parallel with said small signal amplification means, wherein said slew enhancement means includes two differential transistor pairs for providing additional slew output current, and an active load means and a high gain current mirror means connected to said differential transistor pairs for biasing said slew enhancement means to provide said slew output current when said small signal amplification means reaches its slew rate limit;
summing means coupled between the outputs of said small signal amplification means and said slew enhancement means for providing a current output to said output stage for said amplifier circuit.

18. The amplifier circuit of claim 17, wherein said small signal amplification means further includes a pair of current mirror means coupled between said small signal means and the input of said summing means.

19. The amplifier circuit of claim 18, wherein the inputs of each transistor pair of said slew enhancement means is connected in parallel with the inputs of each transistor pair of said small signal amplification means.

* * * * *